(12) United States Patent
Asai et al.

(10) Patent No.: US 9,494,863 B2
(45) Date of Patent: Nov. 15, 2016

(54) CHEMICALLY AMPLIFIED NEGATIVE RESIST COMPOSITION, PHOTO-CURABLE DRY FILM, MAKING METHOD, PATTERNING PROCESS, AND ELECTRIC/ELECTRONIC PART-PROTECTING FILM

(71) Applicant: Shin-Etsu Chemical Co., Ltd., Tokyo (JP)

(72) Inventors: Satoshi Asai, Annaka (JP); Katsuya Takemura, Joetsu (JP); Kyoko Soga, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/862,736

(22) Filed: Sep. 23, 2015

(65) Prior Publication Data
US 2016/0097974 A1    Apr. 7, 2016

(30) Foreign Application Priority Data

Oct. 1, 2014 (JP) .................. 2014-202890

(51) Int. Cl.
| | | |
|---|---|---|
| *G03F 7/075* | (2006.01) | |
| *G03F 7/038* | (2006.01) | |
| *G03F 7/16* | (2006.01) | |
| *G03F 7/20* | (2006.01) | |
| *G03F 7/32* | (2006.01) | |
| *G03F 7/38* | (2006.01) | |
| *G03F 7/40* | (2006.01) | |

(52) U.S. Cl.
CPC .......... *G03F 7/0757* (2013.01); *G03F 7/0382* (2013.01); *G03F 7/168* (2013.01); *G03F 7/2002* (2013.01); *G03F 7/2037* (2013.01); *G03F 7/32* (2013.01); *G03F 7/38* (2013.01); *G03F 7/40* (2013.01)

(58) Field of Classification Search
None
See application file for complete search history.

(56) References Cited

U.S. PATENT DOCUMENTS

| | | | |
|---|---|---|---|
| 7,700,403 B2 | 4/2010 | Arai et al. | |
| 7,785,766 B2 | 8/2010 | Kato et al. | |
| 2012/0213993 A1* | 8/2012 | Takeda | C08G 77/14 428/355 EP |
| 2013/0149645 A1* | 6/2013 | Takemura | G03F 7/0757 430/280.1 |

FOREIGN PATENT DOCUMENTS

| | | |
|---|---|---|
| JP | 2008-184571 A | 8/2008 |
| JP | 2009-200315 A | 9/2009 |

* cited by examiner

*Primary Examiner* — Cynthia Hamilton
(74) *Attorney, Agent, or Firm* — Westerman, Hattori, Daniels & Adrian, LLP

(57) ABSTRACT

A chemically amplified negative resist composition comprising a silicone structure-bearing polymer forms a film which can be readily patterned. The patterned film is tightly adherent to various substrates and suited as protective film on electric/electronic parts because of improved alkali resistance and reliability.

12 Claims, No Drawings

US 9,494,863 B2

CHEMICALLY AMPLIFIED NEGATIVE RESIST COMPOSITION, PHOTO-CURABLE DRY FILM, MAKING METHOD, PATTERNING PROCESS, AND ELECTRIC/ELECTRONIC PART-PROTECTING FILM

CROSS-REFERENCE TO RELATED APPLICATION

This non-provisional application claims priority under 35 U.S.C. §119(a) on Patent Application No. 2014-202890 filed in Japan on Oct. 1, 2014, the entire contents of which are hereby incorporated by reference.

TECHNICAL FIELD

This invention relates to a chemically amplified negative resist composition comprising a silicone structure-bearing polymer which can be patterned by exposure to ultraviolet radiation in near-UV and deep-UV regions having a wavelength below 500 nm such as i and g-line; a photo-curable dry film using the resist composition; a method of preparing the photo-curable dry film; a pattern forming process comprising applying the resist composition or dry film to form a resist film or photo-curable resin layer on a substrate and patterning; and a film for the protection of electric/electronic parts (e.g., wirings, circuits and boards) obtained by curing the resist film or photo-curable resin layer.

Patterned films of a negative resist composition are used to cover wirings, circuits, boards or the like as protective film. The patterned films often encounter a problem of stripping or dissolution in the subsequent processing steps where they are kept in contact with alkali for a long time. Surprisingly, a pattern formed of a chemically amplified negative resist composition according to the invention or a dry film comprising the composition is significantly improved in alkali resistance.

Owing to its advantages including heat resistance, chemical resistance, insulation and flexibility, the protective film formed of the resist composition of the invention finds use as dielectric film for semiconductor devices including redistribution, dielectric film for multilayer printed boards, solder mask, cover lay film, dielectric film for filling in through-silicon vias (TSV), and lamination of substrates.

BACKGROUND ART

As most electronic equipment including personal computers, digital cameras and mobile phones become of smaller size and better performance, there is an increasing demand for semiconductor devices of small size, thin profile and high density. There is a desire to have a photosensitive dielectric material which can accommodate an increase of substrate area for productivity improvement and which can accommodate structures having fine asperities with a high aspect ratio on substrates in the high-density packaging technology as typified by chip size packages or chip scale packages (CSP) or 3D layer stacks.

With respect to the photosensitive dielectric material mentioned above, JP-A 2008-184571 discloses a photo-curable resin composition which can be coated to form films having a widely varying thickness by the spin coating technique commonly used in the semiconductor device fabrication, processed into fine size patterns using radiation of a wide wavelength range, and post-cured at low temperatures into electric/electronic part-protecting films having flexibility, heat resistance, electric properties, adhesion, reliability and chemical resistance. Advantageously, the spin coating technique is capable of simply forming a film on a substrate.

The photo-curable resin composition for forming electric/electronic part-protecting films is used to form a film having a thickness of 1 to 100 μm on a substrate. As the film thickness increases beyond 30 μm, it becomes difficult to apply the photo-curable resin composition onto the substrate by spin coating because the composition must have a very high viscosity. The film formation on substrate by spin coating encounters a certain limit in the practical application.

Also, when the photo-curable resin composition is applied onto a substrate having a rugged surface by spin coating, it is difficult to form a uniform layer on the substrate. The photo-curable resin layer tends to leave voids near steps on the substrate. Further improvements in planarity and step coverage are desired. Another coating technique replacing the spin coat technique is spray coating as disclosed in JP-A 2009-200315. Owing to the principle of spraying, defects are often formed including height difference arising from asperities on the substrate, film rupture at pattern edges and pinholes at recess bottom. The problems of planarity and step coverage still remain unsolved.

Recently, in the high-density package technology as typified by chips scale packages (CSP) or 3D stacked packages, a focus is put on the technique of redistribution from chips by forming a fine, high aspect ratio pattern on a substrate and depositing a metal such as copper on the pattern. To meet a demand for chips of higher density and higher integration, it is strongly desired to reduce the width of pattern lines and the size of contact holes for interconnection between substrates in the redistribution technology. The lithography is generally used for forming fine size patterns. In particular, the lithography combined with chemically amplified negative resist compositions is best suited for forming fine pattern features. Since the pattern used for redistribution is permanently left between device chips, the pattern material must have a cure ability and also serve as an electric/electronic part-protecting film having flexibility, heat resistance, electric properties, adhesion, reliability and chemical resistance. For this reason, a negative resist composition is believed suitable for forming such patterns.

Accordingly, a chemically amplified negative resist composition is typical of the pattern-forming material which can be processed into a fine redistribution layer and serve as an electric/electronic part-protecting film having flexibility, heat resistance, electric properties, adhesion, reliability and chemical resistance.

On the other hand, the negative resist compositions of current frequent use are required to have resistance to various chemicals as the process of fabricating semiconductor devices after pattern formation becomes complex. In particular, there is a need for a negative resist composition which remains fully resistant to alkaline reagents used for removal of plating over a long period of time.

CITATION LIST

Patent Document 1: JP-A 2008-184571 (U.S. Pat. No. 7,785,766)
Patent Document 2: JP-A 2009-200315 (U.S. Pat. No. 7,700,403)

SUMMARY OF INVENTION

A first object of the invention is to provide a chemically amplified negative resist composition capable of forming a pattern having improved alkali resistance, and a pattern forming process using the resist composition.

A second object is to provide a photo-curable dry film comprising the resist composition and a method for preparing the same; and a pattern forming process capable of forming a resist layer having a widely varying thickness even on a substrate having a rugged surface, using the photo-curable dry film.

A third object is to provide a protective film for electric/electronic parts such as wirings, circuits and boards, comprising a cured film obtained by post-curing at low temperature the pattern resulting from the pattern forming process.

The inventors have found that a chemically amplified negative resist composition comprising (A) a silicone structure-bearing polymer having the general formula (1), (B) a polyhydric phenol compound, (C) a photoacid generator, and (D) a solvent can form a fine-size pattern having drastically improved alkali resistance. Using a photo-curable dry film formed of the resist composition, a resist layer having a widely varying thickness can be formed even on a substrate having a rugged surface, and a fine-size pattern be formed therefrom. The cured film resulting from the pattern forming process is useful as an electric/electronic part-protecting film.

Embodiments of the invention are defined below.

In a first aspect, the invention provides a chemically amplified negative resist composition comprising (A) a silicone structure-bearing polymer comprising recurring units of the general formula (1) and having a weight average molecular weight of 3,000 to 500,000,

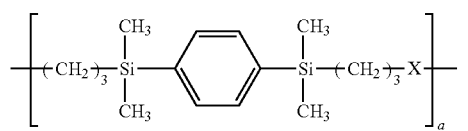

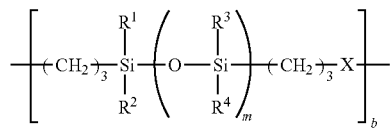

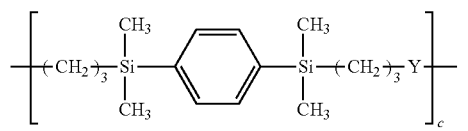

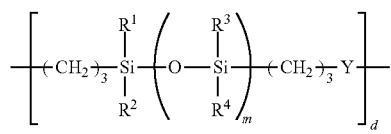

wherein $R^1$ to $R^4$ are each independently a monovalent $C_1$-$C_8$ hydrocarbon group, m is an integer of 1 to 100, a, b, c and d are each independently 0 or a positive number, a+b>0, and a+b+c+d=1, X is a divalent organic group having the general formula (2):

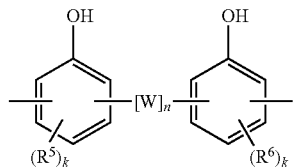

wherein W is a divalent organic group selected from the following:

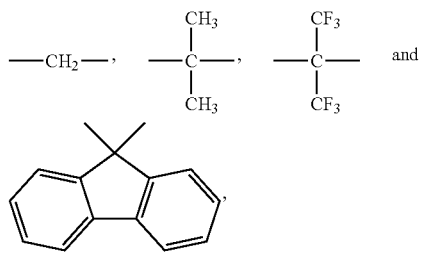

n is 0 or 1, $R^5$ and $R^6$ are each independently a $C_1$-$C_4$ alkyl or alkoxy group, k is independently 0, 1 or 2, Y is a divalent organic group having the general formula (3):

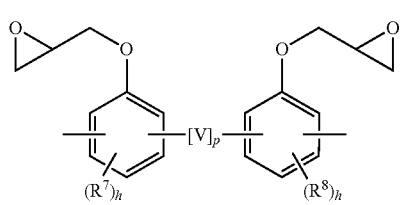

wherein V is a divalent organic group selected from the following:

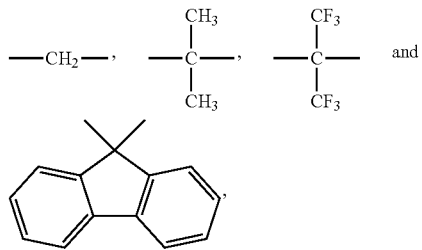

p is 0 or 1, $R^7$ and $R^8$ are each independently a $C_1$-$C_4$ alkyl or alkoxy group, h is independently 0, 1 or 2, (B) at least one compound selected from polyhydric phenols having at least three hydroxyl groups, (C) a photoacid generator which is decomposed to generate an acid upon exposure to radiation of wavelength 190 to 500 nm, and (D) a solvent.

In a preferred embodiment, the resist composition further comprises (E) at least one crosslinker selected from the group consisting of an amino condensate modified with formaldehyde or formaldehyde-alcohol, a phenol compound having on the average at least two methylol or alkoxymethylol groups in the molecule, and a polyhydric phenol compound in which a hydroxyl group is substituted by a glycidoxy group.

In a preferred embodiment, component (B) is at least one compound selected from polyhydric phenols having at least three hydroxyl groups as represented by the general formulae (4-A) to (4-E).

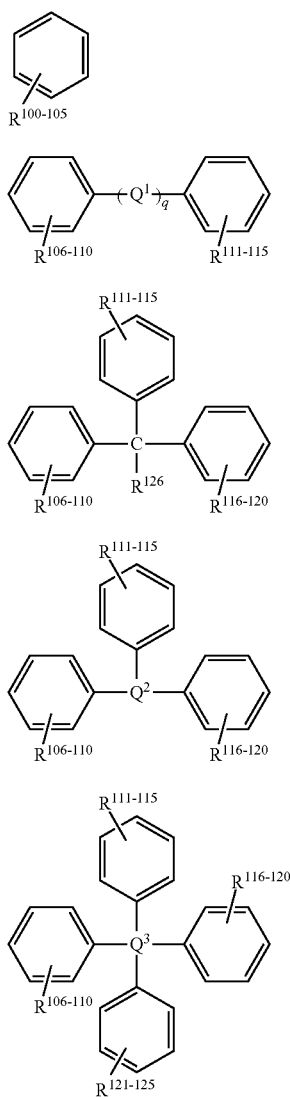

Herein $R^{100}$ to $R^{125}$ are each independently hydrogen, hydroxyl, alkyl, cycloalkyl or aromatic group, which may be halo-substituted, at least three of $R^{100}$ to $R^{125}$ are hydroxyl, $R^{126}$ is hydrogen, hydroxyl, alkyl, cycloalkyl or aromatic group, which may be halo-substituted, $Q^1$ is a structure selected from the following:

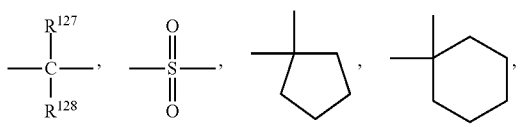

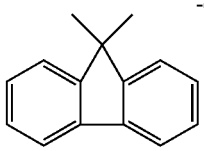

wherein $R^{127}$ and $R^{128}$ are each independently hydrogen, alkyl, cycloalkyl or aromatic group, which may be halo-substituted, q is 0 or 1, $Q^2$ is a structure selected from the following:

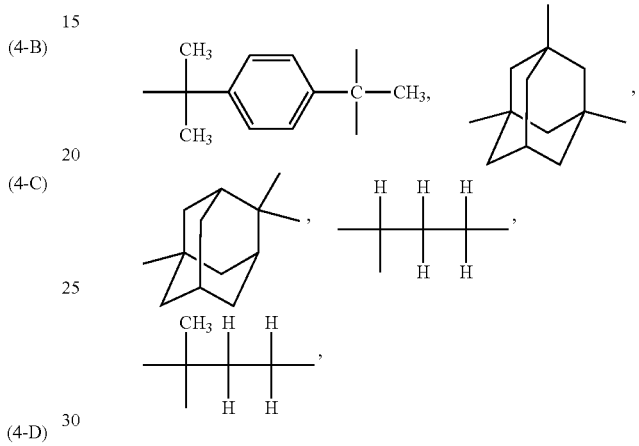

and $Q^3$ is a structure selected from the following:

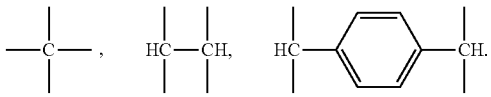

In a second aspect, the invention provides a photo-curable dry film comprising a photo-curable resin layer having a thickness of 5 to 300 μm sandwiched between a support film and a protective film, the photo-curable resin layer being formed of the chemically amplified negative resist composition defined above.

In a third aspect, the invention provides a method for preparing a photo-curable dry film, comprising the steps of:
(i) continuously coating the chemically amplified negative resist composition defined above onto a support film,
(ii) continuously drying the composition to form a photo-curable resin layer on the support film, and
(iii) applying a protective film onto the photo-curable resin layer.

In a fourth aspect, the invention provides a pattern forming process comprising the steps of:
(I) striping the protective film from the photo-curable dry film and placing the bare photo-curable resin layer in close contact with a substrate,
(II) exposing the photo-curable resin layer to high-energy radiation of wavelength 190 to 500 nm or EB through a photomask and through the support film or with the support film stripped off,
(III) post-exposure bake, and
(IV) developing in a developer to pattern the layer.

The process may further comprise (V) post-curing the patterned layer resulting from development step (IV) at a temperature of 100 to 250° C.

In a fifth aspect, the invention provides a pattern forming process comprising the steps of:

(1) coating the chemically amplified negative resist composition of any one of claims 1 to 3 onto a substrate, and prebaking to form a resist film, (2) exposing the resist film to high-energy radiation of wavelength 190 to 500 nm or electron beam through a photomask, (3) baking and developing in a developer to pattern the resist film.

The process may further comprise (4) post-curing the patterned resist film resulting from development step (3) at a temperature of 100 to 250° C.

Also contemplated herein is an electric/electronic part protective film comprising the cured film obtained by the process defined above.

ADVANTAGEOUS EFFECTS OF INVENTION

The chemically amplified negative resist composition is capable of forming a resist pattern having improved alkali resistance. The chemically amplified negative resist composition, photo-curable dry film and pattern forming process according to the invention can form a fine pattern using radiation over a wide span of wavelength, can reduce the size of pattern features in the redistribution technology to meet the demand for chips of higher density and higher integration, inhibit footing or scumming on the pattern bottom and the substrate after pattern formation, and are useful to form an electric/electronic part-protecting film.

DESCRIPTION OF PREFERRED EMBODIMENTS

The terms "a" and "an" herein do not denote a limitation of quantity, but rather denote the presence of at least one of the referenced item. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group. In the chemical formula, the broken line segment denotes a valence bond.

The abbreviations and acronyms have the following meaning.

EB: electron beam
Me: methyl
Mw: weight average molecular weight
GPC: gel permeation chromatography
PEB: post-exposure baking
PAG: photoacid generator Resist Composition Component (A) in the resist composition of the invention is a silicone structure-bearing polymer comprising recurring units represented by the general formula (1) and having a weight average molecular weight (Mw) of 3,000 to 500,000.

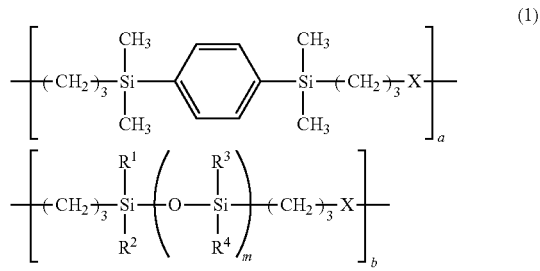

(1)

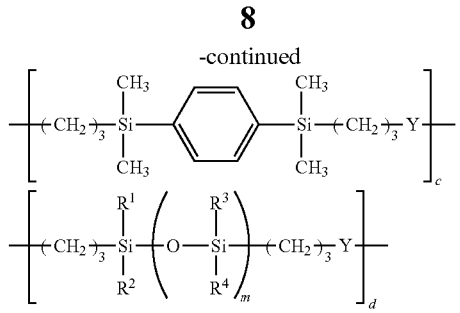

Herein $R^1$ to $R^4$ are each independently a monovalent $C_1$-$C_8$ hydrocarbon group, m is an integer of 1 to 100, a, b, c and d are each independently 0 or a positive number, a+b>0, and a+b+c+d=1, X is a divalent organic group of the general formula (2), and Y is a divalent organic group of the general formula (3), shown below.

In formula (1), each of $R^1$ to $R^4$ which may be the same or different, stands for a monovalent hydrocarbon group having 1 to 8 carbon atoms, and preferably 1 to 6 carbon atoms. Examples include straight, branched or cyclic alkyl groups such as methyl, ethyl, propyl, isopropyl, n-butyl, tert-butyl, and cyclohexyl, straight, branched or cyclic alkenyl groups such as vinyl, allyl, propenyl, butenyl, hexenyl, and cyclohexenyl, aryl groups such as phenyl and tolyl, and aralkyl groups such as benzyl and phenylethyl.

From the standpoints of compatibility with a crosslinker and a PAG to be described later and photo-curability, m is an integer of 1 to 100, preferably 1 to 80. From the standpoints of substrate adhesion, electrical properties, and reliability, a, b, c and d each are 0 or a positive number, with the proviso: a+b>0 and a+b+c+d=1, and preferably c+d>0. Preferably, these subscripts satisfy the range: 0.05≤(c+d)/(a+b+c+d) ≤0.9, more preferably 0.08≤(c+d)/(a+b+c+d)≤0.8, and even more desirably 0.05≤a≤0.9, 0.05≤b≤0.9, 0<c≤0.7, and 0<d≤0.7.

X is a divalent organic group having the general formula (2) and Y is a divalent organic group having the general formula (3). It is noted that component (A) contains at least one divalent organic group of formula (2), preferably at least one divalent organic group of formula (2) and at least one divalent organic group of formula (3).

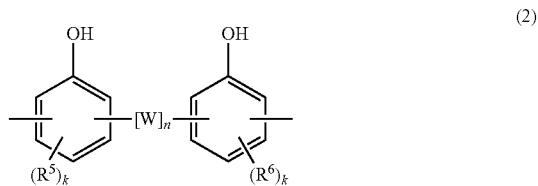

(2)

Herein W is a divalent organic group selected from the following:

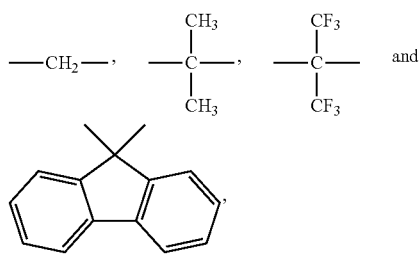

n is 0 or 1, $R^5$ and $R^6$ are each independently a $C_1$-$C_4$ alkyl or alkoxy group, and k is independently 0, 1 or 2.

Examples of the alkyl and alkoxy groups represented by $R^5$ and $R^6$ include methyl, ethyl, isopropyl, tert-butyl, methoxy, ethoxy, and isopropyloxy.

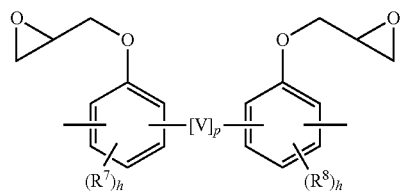

(3)

Herein V is a divalent organic group selected from the following:

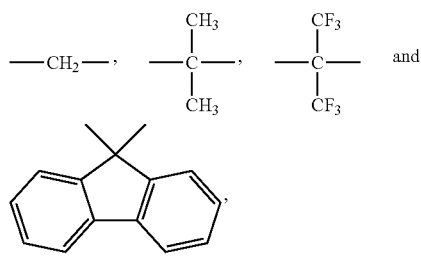

p is 0 or 1, $R^7$ and $R^8$ are each independently a $C_1$-$C_4$ alkyl or alkoxy group, and h is independently 0, 1 or 2.

Examples of the groups represented by $R^7$ and $R^8$ are the same as exemplified for $R^5$ and $R^6$.

The silicone structure-bearing polymer should have a weight average molecular weight (Mw) of 3,000 to 500,000 and preferably 5,000 to 300,000, from the standpoints of compatibility and photo-curability of a resist composition comprising the polymer as well as mechanical properties of the cured composition. It is noted that Mw is determined by GPC versus polystyrene standards.

Component (B) is a polyhydric phenol compound having at least 3, preferably 3 to 20, and more preferably 3 to 10 hydroxyl groups. Suitable polyhydric phenol compounds include phenol, bisphenol A, alkyl phenols such as p-tert-butylphenol, octylphenol, and p-cumylphenol, resol type phenolic resins derived from cresol, novolak type phenolic resins, and compounds of the structure having the general formulae (4-A) to (4-E). Inter alia, at least one compound selected from the compounds of the structure having formulae (4-A) to (4-E) is preferred.

If the phenol compound as one or two hydroxyl groups, the crosslinking density becomes low, resulting in no film formation. Even if film is formed, the strength of the film is small, resulting in low alkali resistance.

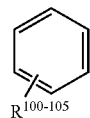

(4-A)

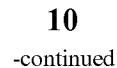

(4-B)

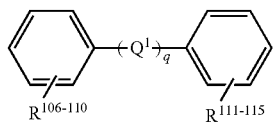

(4-C)

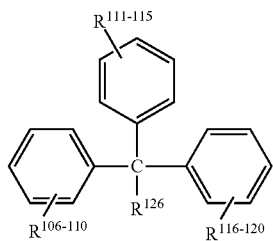

(4-D)

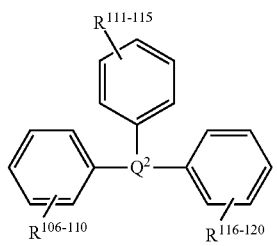

(4-E)

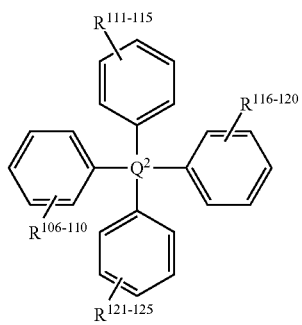

In formulae (4-A) to (4-E), at least three of $R^{100}$ to $R^{125}$ are hydroxyl, the remainder of $R^{100}$ to $R^{125}$ are each independently hydrogen, hydroxyl, $C_1$-$C_{10}$ alkyl, $C_3$-$C_{10}$ cycloalkyl or $C_6$-$C_{20}$ aromatic group, some of which may be halo-substituted. Exemplary aromatic groups are aryl groups, typically phenyl.

In formula (4-B), $Q^1$ is a structure selected from the following:

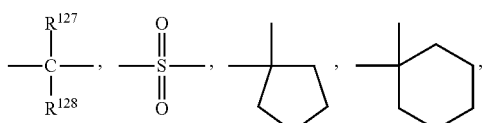

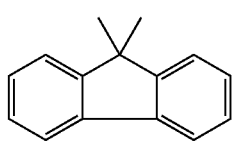

wherein $R^{127}$ and $R^{128}$ are each independently hydrogen, $C_1$-$C_{10}$ alkyl, $C_3$-$C_{10}$ cycloalkyl or $C_6$-$C_{20}$ aromatic group, some of which may be halo-substituted, and q is 0 or 1.

In formula (4-C), $R^{126}$ is hydrogen, hydroxyl, $C_1$-$C_{10}$ alkyl, $C_3$-$C_{10}$ cycloalkyl or $C_6$-$C_{20}$ aromatic group, some of which may be halo-substituted.

In formula (4-D), $Q^2$ is a structure selected from the following.
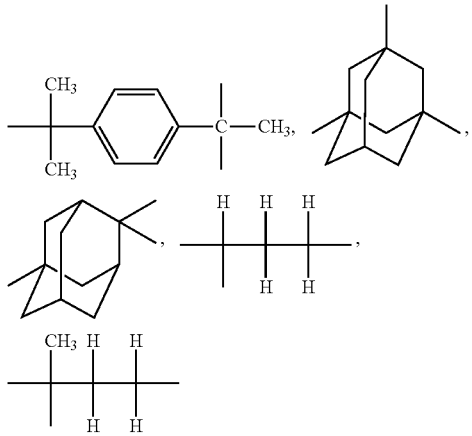
In formula (4-E), $Q^3$ is a structure selected from the following.
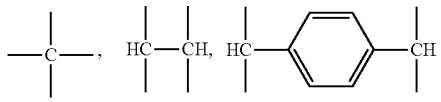
Examples of the polyhydric phenol compound represented by formula (4-A) include pyrogallol, phloroglucinol, and 1,2,4-benzenetriol.
Examples of the polyhydric phenol compounds represented by formulae (4-B) to (4-E) are shown below.
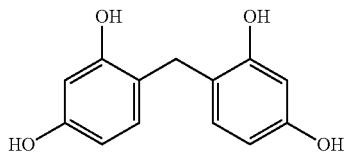
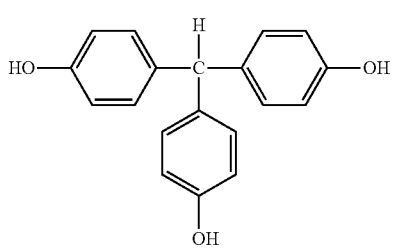
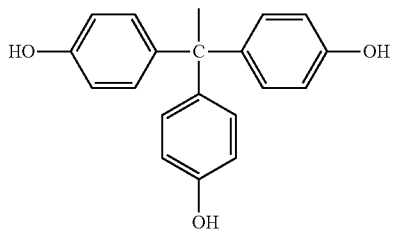
-continued
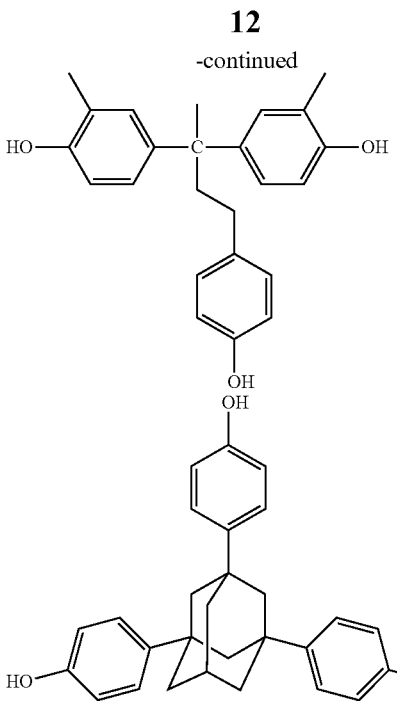
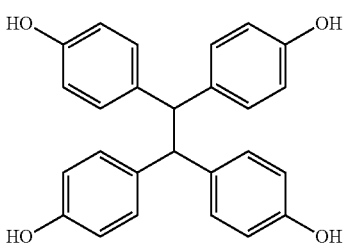
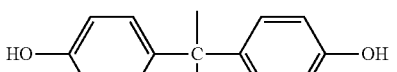
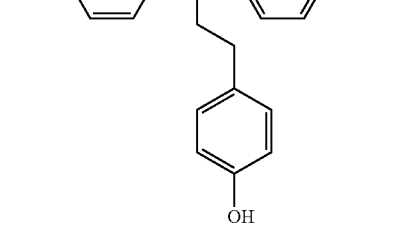
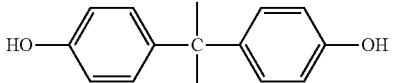
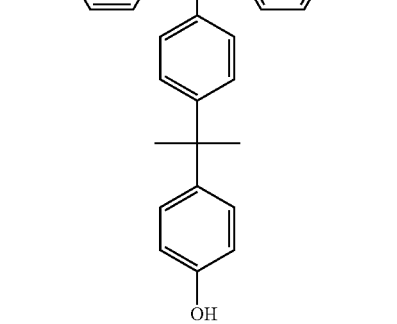

-continued

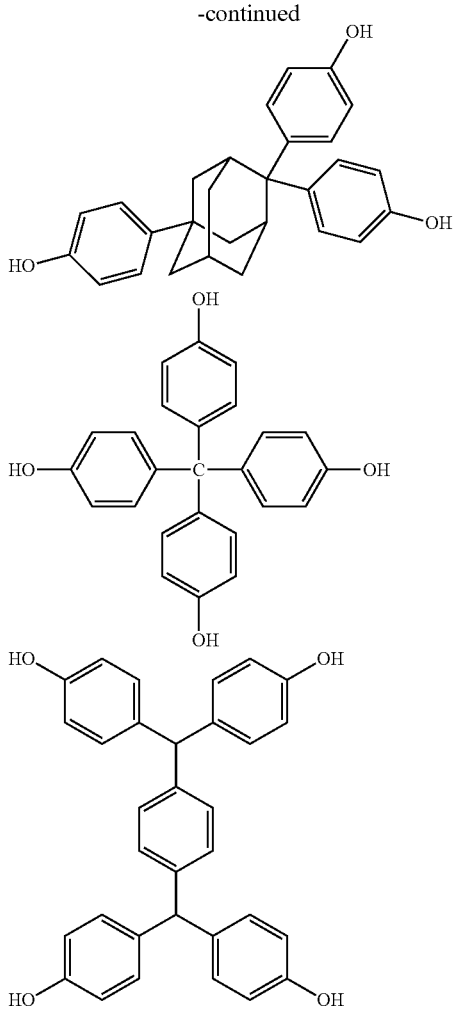

It is preferred from the standpoints of photo-curability of a resist composition and reliability of a post-cured film as electric/electronic part-protecting film to blend the polyhydric phenol compound (B) in an amount of 0.5 to 50 parts, more preferably 1 to 30 parts by weight per 100 parts by weight of the silicone structure-bearing polymer (A). A resist composition containing less than 0.5 pbw of the polyhydric phenol may be insufficient in alcohol resistance whereas more than 50 pbw of the polyhydric phenol may adversely affect resolution.

Component (C) is a photoacid generator. It is typically a compound which generates an acid upon exposure to light of wavelength 190 to 500 nm, the acid generated serving as a curing catalyst. Since the resist composition of the invention is highly compatible with the PAG, the PAG may be selected from a wide variety of such compounds. Typical PAGs include onium salts, diazomethane derivatives, glyoxime derivatives, β-ketosulfone derivatives, disulfone derivatives, nitrobenzyl sulfonate derivatives, sulfonic acid ester derivatives, imido-yl sulfonate derivatives, oxime sulfonate derivatives, imino sulfonate derivatives, and triazine derivatives.

Exemplary onium salts are compounds of the following general formula (13).

$$(R^{13})_j M^+ K^- \quad (13)$$

Herein, $R^{13}$ is a straight, branched or cyclic $C_1$-$C_{12}$ alkyl group, $C_6$-$C_{12}$ aryl group or $C_7$-$C_{12}$ aralkyl group, which may have a substituent; $M^+$ is iodonium or sulfonium; $K^-$ is a non-nucleophilic counter ion; and j is 2 or 3.

Illustrative examples of alkyl groups represented by $R^{13}$ include methyl, ethyl, propyl, butyl, cyclohexyl, 2-oxocyclohexyl, norbornyl, and adamantyl. Exemplary aryl groups include phenyl; alkoxyphenyl groups such as o-, m- or p-methoxyphenyl, ethoxyphenyl, m- or p-tert-butoxyphenyl; and alkylphenyl groups such as 2-, 3- or 4-methylphenyl, ethylphenyl, 4-tert-butylphenyl, 4-butylphenyl, and dimethylphenyl. Exemplary aralkyl groups include benzyl and phenethyl.

Examples of the non-nucleophilic counter ion represented by $K^-$ include halide ions such as chloride and bromide; fluoroalkylsulfonate ions such as triflate, 1,1,1-trifluoromethanesulfonate, and nonafluorobutanesulfonate; arylsulfonate ions such as tosylate, benzenesulfonate, 4-fluorobenzenesulfonate, and 1,2,3,4,5-pentafluorobenznesulfonate; and alkylsulfonate ions such as mesylate and butanesulfonate.

Exemplary diazomethane derivatives are compounds of the following general formula (14).

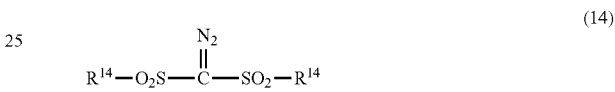

(14)

Herein, $R^{14}$, which may be the same or different, is a straight, branched or cyclic $C_1$-$C_{12}$ alkyl or haloalkyl group, $C_6$-$C_{12}$ aryl or haloaryl group, or $C_7$-$C_{12}$ aralkyl group.

Illustrative examples of alkyl groups represented by $R^{14}$ include methyl, ethyl, propyl, butyl, amyl, cyclopentyl, cyclohexyl, norbornyl, and adamantyl. Exemplary haloalkyl groups include trifluoromethyl, 1,1,1-trifluoroethyl, 1,1,1-trichloroethyl, and nonafluorobutyl. Exemplary aryl groups include phenyl; alkoxyphenyl groups such as o-, m- or p-methoxyphenyl, ethoxyphenyl, m- or p-tert-butoxyphenyl; and alkylphenyl groups such as 2-, 3- or 4-methylphenyl, ethylphenyl, 4-tert-butylphenyl, 4-butylphenyl, and dimethylphenyl. Exemplary haloaryl groups include fluorophenyl, chlorophenyl, and 1,2,3,4,5-pentafluorophenyl. Exemplary aralkyl groups include benzyl and phenethyl.

Illustrative examples of the PAG include:
onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, and diphenyl(4-thiophenoxyphenyl)sulfonium hexafluoroantimonate;

diazomethane derivatives such as bis(benzenesulfonyl) diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl) diazomethane, bis(sec-butylsulfonyl)diazomethane, bis(n-propylsulfonyl)diazomethane, bis(isopropylsulfonyl) diazomethane, bis(tert-butylsulfonyl)diazomethane, bis(n-amylsulfonyl)diazomethane, bis(isoamylsulfonyl) diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyxoime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

oxime sulfonate derivatives such as α-(benzenesulfoniumoxyimino)-4-methylphenylacetonitrile;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene;

imido-yl sulfonate derivatives such as phthalimidyl triflate, phthalimidyl tosylate, 5-norbornene-2,3-dicarboxyimidoyl triflate, 5-norbornene-2,3-dicarboxyimidoyl tosylate, 5-norbornene-2,3-dicarboxyimidoyl n-butylsulfonate, and n-trifluoromethylsulfonyloxynaphthylimide;

iminosulfonates such as (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)acetonitrile, as well as 2-methyl-2[(4-methylphenyl)sulfonyl]-1-[(4-methylthio)-phenyl]-1-propane.

Among others, imido-yl sulfonates, imino sulfonates and oxime sulfonates are preferred.

The PAGs may be used alone or in admixture of two or more. It is preferred from the standpoints of photo-absorption of the PAG itself and photo-curability of a thick film that the PAG be added in an amount of 0.05 to 20 parts by weight, and especially 0.2 to 5 parts by weight, per 100 parts by weight of the silicone structure-bearing polymer. Outside the range, a less amount of the PAG may generate too less an amount of acid to form a pattern whereas an excess of the PAG; may generate an excess of acid which will diffuse into the unexposed region to cause curing.

Component (D) is a solvent. It may be any organic solvent in which the silicone structure-bearing polymer, PAG and crosslinker (to be described later) are soluble. Illustrative, non-limiting, examples of the organic solvent include ketones such as cyclohexanone, cyclopentanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone. These solvents may be used alone or in combinations of two or more thereof. Of these solvents, preferred are ethyl lactate, cyclohexanone, cyclopentanone, PGMEA, γ-butyrolactone, and mixtures thereof, in which the PAG is most soluble.

It is preferred from the standpoints of compatibility, viscosity and ease of coating of the resulting resist composition that the solvent (D) be used in an amount of 50 to 2,000 parts, and especially 100 to 1,000 parts by weight per 100 parts by weight of the silicone structure-bearing polymer, PAG and crosslinker combined.

In the resist composition, (E) a crosslinker is preferably blended. The crosslinker (E) is at least one member selected from the group consisting of an amino condensate modified with formaldehyde or formaldehyde-alcohol, a phenol compound having on the average at least two methylol or alkoxymethylol groups in the molecule, a polyhydric phenol compound in which a hydroxyl group is substituted by a glycidoxy group.

The amino condensate modified with formaldehyde or formaldehyde-alcohol includes, for example, melamine condensates modified with formaldehyde or formaldehyde-alcohol, and urea condensates modified with formaldehyde or formaldehyde-alcohol.

The modified melamine condensates are prepared, for example, by modifying a melamine monomer with formaldehyde into a methylol form in a well-known manner, and optionally, further modifying it with an alcohol into an alkoxy form, thereby yielding a modified melamine of the general formula (12) shown below. The alcohols used herein are lower alcohols, for example, alcohols having 1 to 4 carbon atoms.

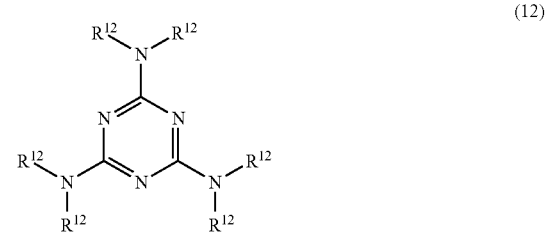

(12)

Herein, $R^{12}$, which may be the same or different, is a methylol group, an alkoxymethyl group containing a $C_1$-$C_4$ alkoxy moiety, or hydrogen, and at least one $R^{12}$ is a methylol or alkoxymethyl group. Specifically, $R^{12}$ is a methylol group, an alkoxymethyl group such as methoxymethyl or ethoxymethyl, or hydrogen. Illustrative, non-limiting, examples of the modified melamine of formula (12) include trimethoxymethylmonomethylolmelamine, dimethoxymethylmonomethylolmelamine, trimethylolomelamine, hexamethylolmelamine, and hexamethoxymethylolmelamine. Next, the modified melamine of formula (12) or an oligomer thereof (e.g., dimer or trimer) is subjected to addition condensation polymerization with formaldehyde in a customary way until a desired molecular weight is reached, thereby obtaining the formaldehyde or formaldehyde-alcohol-modified melamine condensate.

Also, the urea condensates modified with formaldehyde or formaldehyde-alcohol are prepared, for example, by modifying a urea condensate having a desired molecular weight with formaldehyde into a methylol form in a well-known manner, and optionally, further modifying it with an alcohol into an alkoxy form. Illustrative examples of the modified urea condensate include methoxymethylated urea condensates, ethoxymethylated urea condensates, and propoxymethylated urea condensates.

These modified melamine condensates and modified urea condensates may be used alone or in admixture of two or more.

Examples of the phenol compound having on the average at least two methylol or alkoxymethylol groups in a molecule include (2-hydroxy-5-methyl)-1,3-benzenedimethanol and 2,2',6,6'-tetramethoxymethylbisphenol A. These phenol compounds may be used alone or in admixture of two or more.

Examples of the polyhydric phenol compound whose hydroxyl group is substituted by a glycidoxy group include 1,1'-diglycidoxybisphenol A, tris(4-glycidoxyphenyl)methane, and 1,1,1-tris(4-glycidoxyphenyl)ethane, which are obtained by reacting hydroxyl groups of bisphenol A, tris(4-hydroxyphenyl)methane, and 1,1,1-tris(4-hydroxyphenyl)ethane with epichlorohydrin in the presence of a base. These polyhydric phenol compounds whose hydroxyl group is substituted by a glycidoxy group may also be used alone or in admixture of two or more.

The crosslinker induces curing reaction with the silicone structure-bearing polymer for facilitating pattern formation and augmenting the strength of a cured product. The crosslinker should preferably have a weight average molecular weight (Mw) of 150 to 10,000, and more preferably 200 to 3,000, from the standpoints of photo-curability and heat resistance.

The crosslinkers may be used alone or in admixture of two or more. It is preferred from the standpoints of photo-curability and reliability of a protective film after post-curing that the crosslinker be used in an amount of 0 to 50 parts, and especially 1 to 30 parts by weight per 100 parts by weight of the silicone structure-bearing polymer (A). An excess of the crosslinker may give rise to the problem of reduced resolution due to merging of pattern features.

In the resist composition, (F) a cure accelerator may be blended, when the silicone structure-bearing polymer contain an epoxy group. The cure accelerator is a compound having a function of accelerating the curing rate when the silicone structure-bearing composition containing an epoxy group cures. Suitable accelerators include tertiary amines and salts thereof, and imidazoles. As the cure accelerator, commercially available products may be used, for example, imidazole compounds 2MZ-A, 2MZ-OK, 2PHZ, 2P4BHZ, and 2P4MHZ-PW (Shikoku Chemicals Corp.), dimethylamine block isocyanate compounds U-CAT 3503N and U-CAT 3502 T (San-Apro Ltd.), dicyclic amidine compounds and salts DBU, DBN, U-CAT SA102 and U-CAT 5002 (San-Apro Ltd.).

From the standpoint of sensitivity, the cure accelerator is preferably blended in an amount of 0 to 3 parts, more preferably 0 to 1 parts by weight per 100 parts by weight of the silicone structure-bearing polymer (A). An excess of the accelerator may adversely affect resolution whereby the pattern may be degraded. When used, the cure accelerator is preferably blended in an amount of at least 0.1 part by weight.

If desired, (G) a basic compound may be added to the resist composition. The basic compound used herein is preferably a compound capable of suppressing the rate of diffusion when the acid generated by the PAG diffuses within the resist film. The inclusion of the basic compound improves resolution, suppresses changes in sensitivity following exposure and reduces substrate and environment dependence, as well as improving the exposure latitude and the pattern profile.

Examples of the basic compound include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylethylenediamine, N,N-dimethylethylenediamine, and N,N-dimethyltetraethylenepentamine.

Examples of suitable tertiary aliphatic amines include trimethylamine, triethylamine, tri-n-propylamine, triisopropylamine, tri-n-butylamine, triisobutylamine, tri-sec-butylamine, tripentylamine, triethanolamine, tert-butyldiethanolamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazol), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinon, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridin, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable nitrogen-containing compounds with sulfonyl group include 3-pyridinesulfonic acid and pyridinium p-toluenesulfonate.

Examples of suitable nitrogen-containing compounds with hydroxyl group, nitrogen-containing compounds with hydroxyphenyl group, and alcoholic nitrogen-containing compounds include 2-hydroxypyridin, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholin, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide.

Suitable imide derivatives include phthalimide, succinimide, and maleimide.

Also included are compounds of the general formula (5).

$$N(\alpha)_e(\beta)_{3-e} \quad (5)$$

Herein, e is equal to 1, 2 or 3; side chain β is independently hydrogen or a straight, branched or cyclic $C_1$-$C_{20}$ alkyl group which may contain an ether bond or hydroxyl group; and side chain α is independently selected from substituent groups of the following general formulas (6) to (8), and two or three α's may bond together to form a ring.

$$\mathrm{-[R^{300}-O-R^{301}]} \quad (6)$$

$$\mathrm{-[R^{302}-O-R^{303}-\overset{O}{\underset{\|}{C}}-R^{304}]} \quad (7)$$

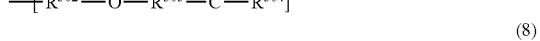

$$\mathrm{-[R^{305}-\overset{O}{\underset{\|}{C}}-O-R^{306}]} \quad (8)$$

In the formulas, $R^{300}$, $R^{302}$ and $R^{305}$ are each independently a straight or branched $C_1$-$C_4$ alkylene group. $R^{301}$ and $R^{304}$ are each independently hydrogen, a straight, branched or cyclic $C_1$-$C_{20}$ alkyl group which may contain at least one hydroxyl group, ether bond, ester bond or lactone ring. $R^{303}$ is a single bond or a straight or branched $C_1$-$C_4$ alkylene group. $R^{306}$ is a straight, branched or cyclic $C_1$-$C_{20}$ alkyl group which may contain at least one hydroxyl group, ether bond, ester bond or lactone ring.

Examples of the compounds of formula (5) include tris[2-(methoxymethoxy)ethyl]amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetrxaoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxymethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-

2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-methylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine, and β-(diethylamino)-δ-valerolactone.

The basic compounds may be used alone or in admixture of two or more. From the standpoint of sensitivity, the basic compound may be formulated in an amount of 0 to 3 parts, and preferably 0.01 to 1 part by weight per 100 parts by weight of the silicone structure-bearing polymer. An excess of the basic compound may adversely affect resolution whereby to the pattern may be degraded.

In addition to the aforementioned components, the resist composition may include optional additives. A typical additive is a surfactant which is commonly used for improving the coating characteristics. Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad FC-4430 from Sumitomo 3M Ltd., Surflon S-141 and S-145 from Asahi Glass Co., Ltd., Unidyne DS-401, DS-4031, and DS-451 from Daikin Industries Ltd., Megaface F-8151 from DIC Corp., and X-70-093 from Shin-Etsu Chemical Co., Ltd. Preferred surfactants include Fluorad FC-4430 and X-70-093.

Also a light absorber may be added for improving the light absorption efficiency of PAG. Exemplary light absorbers include diaryl sulfoxides, diaryl sulfones, 9,10-dimethylanthracene and 9-fluorenone.

The chemically amplified negative resist composition of the invention is prepared in a conventional way. For example, it can be prepared by agitating and mixing the aforementioned components and optional additives in the solvent and passing the mixture through a filter to remove solid impurities.

The resist composition thus prepared may be advantageously used with electric/electronic parts, for example, as protective film on semiconductor devices, protective film on wirings, cover lay film, solder mask, and TSV dielectric film.

Pattern Forming Process

A further embodiment of the invention is a pattern forming process comprising the steps of:

(1) coating the chemically amplified negative resist composition defined above onto a substrate, and prebaking to form a resist film, (2) exposing the resist film to high-energy radiation of wavelength 190 to 500 nm or electron beam through a photomask, (3) baking and developing in a developer to pattern the resist film, and optionally and preferably, (4) heating the patterned resist film from the development step for post-curing, thereby yielding a protective film for electric/electronic parts.

In step (1) of the pattern forming process, the resist composition is coated onto a substrate to form a resist film. Examples of the substrate used herein include silicon wafers, TSV silicon wafers, plastic and ceramic circuit boards. Also included are those substrates having an entirely or locally metallized surface, specifically having Cu, Ni or Au deposited on the surface by ion sputtering or plating.

Any well-known lithography may be used in coating and processing the negative resist composition. Specifically, the resist composition is applied onto a substrate by a well-known technique such as dipping, spin coating or roll coating, and prebaked to form a resist film. The coating weight may be suitably selected for a particular purpose although it is preferred that the resist film have a thickness of 0.1 to 200 µm, more preferably 1 to 180 µm, and even more preferably 3 to 150 µm. Notably, the film thickness may be measured by an optical interference film thickness gauge, for example. Prebake is performed to evaporate off the solvent in order to facilitate the photo-curing reaction by exposure. The prebake is typically at 40 to 140° C. for 1 minute to 1 hour.

In step (2), a photomask having the desired pattern is placed above the resist film, which is exposed to high-energy radiation of wavelength 190 to 500 nm or EB. The photomask may be a mask perforated in the desired pattern, for example. The photomask is made of a material which can shield high-energy radiation of wavelength 190 to 500 nm or EB, for example, chromium or chromium-based material, though not limited thereto. Examples of the high-energy radiation of wavelength 190 to 500 nm or EB include radiation of varying wavelength from a radiation-generating device, such as UV radiation, typically g, h or i-line, and deep UV (248 nm, 193 nm). A wavelength range of 248 to 436 nm is preferable. The exposure dose is preferably 10 to 3,000 mJ/cm$^2$.

In step (3), the resist film is baked (PEB) and developed in a developer. PEB is performed for the purpose of increasing development sensitivity. The PEB is preferably at 40 to 200° C., especially at 100 to 150° C., for 0.5 to 10 minutes.

Following the exposure and PEB, the resist film is developed in a developer. Any organic solvents may be used as the developer. Suitable solvents include alcohols such as isopropyl alcohol (IPA), ketones such as cyclohexanone, glycols such as propylene glycol monomethyl ether, and esters such as propylene glycol monomethyl ether acetate (PGMEA). The preferred developer is the same organic solvent as used in the resist composition.

Development is effected in a conventional manner, for example, by dipping the pattern-bearing substrate in the developer. The development is followed by washing, rinsing and drying if necessary. There is obtained a resist film having the desired pattern. As a result of development, the unexposed region of resist is dissolved away and the exposed region of resist is left as a pattern due to crosslinking.

Although the pattern forming process has been described, it is sometimes unnecessary to form a pattern. When it is simply desired to form a uniform film, for example, the same process as above may be followed except that the photomask is not used, that is, flood exposure to high-energy radiation of wavelength 190 to 500 nm or EB.

If desired and preferably, the patterned film may be post-cured by heating in an oven or hot plate at 100 to 250° C., preferably 150 to 220° C. Post-curing at a temperature of 100 to 250° C. is effective for increasing the crosslinking density of the resist film and removing the residual volatile matter. Then a film having augmented adhesion to substrates, heat resistance, high strength and good electrical properties can be formed. The post-curing time may range from 10 minutes to 10 hours.

Since the cured film obtained in the above-described way has heat resistance, flexibility, dielectric properties, mechanical properties, substrate adhesion, and chemical resistance in solder flux fluids, it can be advantageously used as a protective film on electric and electronic components and semiconductor devices.

Photo-Curable Dry Film

Using the resist composition, a photo-curable dry film may be manufactured. A further embodiment of the invention is a photo-curable dry film comprising a photo-curable resin layer sandwiched between a support film and a protective film, the photo-curable resin layer being obtained by coating and drying the resist composition to the support film.

The photo-curable resin layer is solid. Since the photo-curable resin layer is solventless, it eliminates the risk that bubbles resulting from volatilization of a solvent are left within the resin layer and between the resin layer and the rugged substrate surface. An appropriate thickness range exists for the resin layer when planarity and step coverage on rugged substrate surface and substrate stacking interval are taken into account. Accordingly, from the standpoints of planarity, step coverage and substrate stacking interval, the photo-curable resin layer should have a thickness of 5 to 300 µm, preferably 10 to 150 µm.

The photo-curable dry film has the advantage that when tightly attached to a substrate having asperities on its surface, the photo-curable resin layer is coated so as to conform to the asperities, achieving high planarity. Particularly because the photo-curable resin layer is composed mainly of the above-mentioned resist composition, higher planarity is achievable owing to the advantage of low surface tension. Further, if the photo-curable resin layer is brought in close contact with the substrate in a vacuum environment, this is effective for inhibiting gaps from generating therebetween.

Now the method for manufacturing the photo-curable dry film is described. The method for preparing a photo-curable dry film involves the steps of:

(i) continuously coating the chemically amplified negative resist composition onto a support film, (ii) continuously drying the composition to form a photo-curable resin layer on the support film, and (iii) applying a protective film onto the photo-curable resin layer.

An apparatus for manufacturing the photo-curable dry film may be a film coater commonly used in the manufacture of pressure-sensitive adhesive products. Suitable film coaters include, for example, a comma coater, comma reverse coater, multiple coater, die coater, lip coater, lip reverse coater, direct gravure coater, offset gravure coater, three-roll bottom reverse coater, and four-roll bottom reverse coater.

The support film is unwound from a supply roll in the film coater, passed across the head of the film coater where the resist composition is coated onto the support film to the predetermined buildup, and then moved through a hot air circulating oven at a predetermined temperature for a predetermined time, where the photo-curable resin layer is dried on the support film. Thereafter, the support film having the photo-curable resin layer thereon and a protective film which is unwound from another supply roll in the film coater are passed across a laminate roll under a predetermined pressure whereby the protective film is bonded to the photo-curable resin layer on the support film, whereupon the laminate is wound up on a take-up roll in the film coater. The buildup of the resist composition is selected such that the resulting photo-curable resin layer may have the desired thickness. Preferably, the oven temperature is 25 to 150°, the time is 1 to 100 minutes, and the bonding pressure is 0.01 to 5 MPa.

The support film used in the photo-curable dry film may be a single film or a multilayer film consisting of a plurality of stacked polymer layers. Examples of the film material include synthetic resins such as polyethylene, polypropylene, polycarbonate and polyethylene terephthalate (PET), with the PET film being preferred for appropriate flexibility, mechanical strength and heat resistance. These films may have been pretreated such as by corona treatment or coating of a release agent. Such films are commercially available, for example, Cerapeel® WZ(RX) and Cerapeel® BX8(R) from Toray Advanced Film Co., Ltd.; E7302 and E7304 from Toyobo Co., Ltd.; Purex® G31 and Purex® G71T1 from Teijin DuPont Films Japan Ltd.; and PET38×1-A3, PET38×1-V8 and PET38×1-X08 from Nippa Co., Ltd.

The protective film used in the photo-curable dry film may be similar to the support film. Among others, PET and polyethylene films having an appropriate flexibility are preferred. Such films are also commercially available. For example, PET films are as mentioned above, and polyethylene films include GF-8 from Tamapoly Co., Ltd. and PE film 0 type from Nippa Co., Ltd.

Both the support and protective films preferably have a thickness of 10 to 100 µm, more preferably 25 to 50 µm, for consistent manufacture of photo-curable dry film, and prevention of wrapping on a take-up roll, i.e., anti-curling.

On use of the photo-curable dry film, the protective film is stripped therefrom before the bare resin layer is attached to an electric/electronic part.

A still further embodiment of the invention is a pattern forming process comprising the steps of:

(I) stripping the protective film from the photo-curable dry film and placing the bare photo-curable resin layer in close contact with a substrate, (II) exposing the photo-curable resin layer to high-energy radiation of wavelength 190 to 500 nm or EB through a photomask and through the support film or with the support film stripped off, (III) post-exposure bake, (IV) developing in a developer to pattern the layer, and optionally and preferably, (V) post-curing the patterned layer resulting from development step (IV) at a temperature of 100 to 250° C. In this way, a protective film for electric/electronic parts is obtained.

Specifically, after the protective film is stripped, the photo-curable dry film is placed in close contact with a substrate using a film attachment apparatus. The substrate used herein may be selected from silicon wafers, TSV silicon wafers, silicon wafers thinned by back side polishing, plastic and ceramic substrates, and those substrates having an entirely or locally metallized surface, specifically having Ni or Au deposited on the surface by ion sputtering or plating. Also useful is a substrate provided with holes or grooves having an opening width of 10 to 100 μm and a depth of 10 to 120 μm.

The film attachment apparatus is preferably a vacuum laminator. The photo-curable dry film is mounted in the film attachment apparatus where the protective film is stripped from the dry film. In the vacuum chamber kept at a predetermined vacuum, the bare photo-curable resin layer of the dry film is closely bonded to the substrate on a table at a predetermined temperature, using a bonding roll under a predetermined pressure. Preferably, the temperature is 60 to 120° C., the pressure is 0 to 5.0 MPa, and the vacuum is 50 to 500 Pa.

The film attachment may be repeated plural times until a photo-curable resin layer of the desired thickness is obtained. For example, the film attachment is repeated 1 to 10 times to form a resin layer having a thickness of 10 to 1,000 μm, especially 100 to 500 μm.

The assembly of the photo-curable resin layer on the substrate may be prebaked, if necessary, for facilitating photo-cure reaction of the photo-curable resin layer or enhancing the adhesion between the photo-curable resin layer and the substrate. Prebake may be, for example, at 40 to 140° C. for 1 minute to 1 hour. The photo-curable resin layer attached to the substrate may be subjected to the steps of exposure, development and post-curing in the same manner as in pattern formation from the resist composition. It is noted that the support film is removed from the photo-curable to dry film, at a stage prior to the prebake or prior to PEB, by any suitable means such as mechanical stripping.

Since the cured film obtained from the resist composition or photo-curable dry film possesses heat resistance, flexibility, dielectric properties, mechanical properties and adhesion to substrate, it finds use as protective film for electric/electronic parts such as semiconductor devices.

EXAMPLE

Synthesis Examples, Examples and Comparative Examples are given below by way of illustration and not by way of limitation. All parts are by weight (pbw).

Compounds M-1 to M-7 used in Synthesis Examples have the chemical structure shown below.

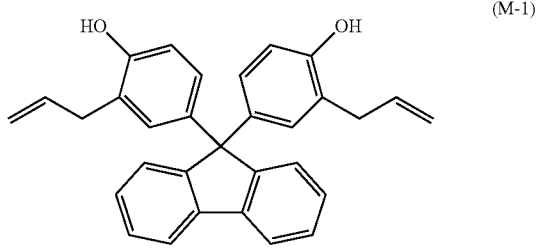
(M-1)

-continued

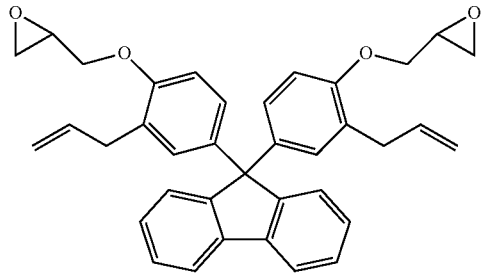
(M-2)

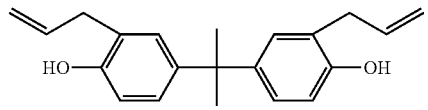
(M-3)

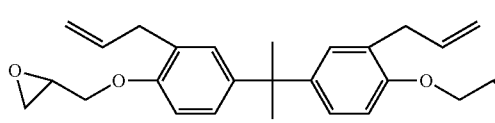
(M-4)

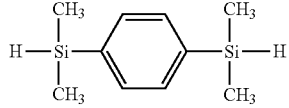
(M-5)

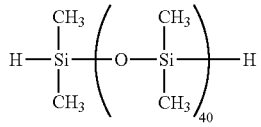
(M-6)

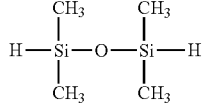
(M-7)

Synthesis Example 1

In a 5-L flask equipped with a stirrer, thermometer, nitrogen purging line and reflux condenser, 405.0 g of compound M-1 and 40.0 g of compound M-4 were dissolved in 1,875 g of toluene. To the solution, 949.6 g of compound M-6 and 6.1 g of compound M-7 were added, and it was heated at 60° C. To the flask, 2.2 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 2.2 g of platinum-on-carbon catalyst (5 wt %) was admitted, and 107.5 g of compound M-5 was added dropwise over 1 hour. At this point, the flask internal temperature rose to 78° C. After the dropwise addition, the reaction solution was ripened for 1.5 hours at 90° C., then cooled to room temperature. To the reaction solution was added 1,700 g of methyl isobutyl ketone. The reaction solution was filtered through a filter under pressure to remove the platinum catalyst. To the polymer solution thus obtained, 760 g of deionized water was added, followed by stirring and stationary holding for separation. The lower layer or water layer was removed. This washing/separatory operation was repeated 6 times, thereby removing the trace acid value from the polymer solution. The solvent was distilled off in vacuum from the polymer solution and instead, 950 g of cyclopentanone was added. There was obtained a polymer solution (A-1) in cyclopentanone having a solid concentration of 60 wt %. The polymer in the solution was measured for molecular weight by GPC versus polystyrene standards, finding a Mw of 31,000. The polymer corresponded to formula (1) wherein molar fractions a=0.550, b=0.358, c=0.056, and d=0.036, as calculated from the charges. X and Y are as shown below.

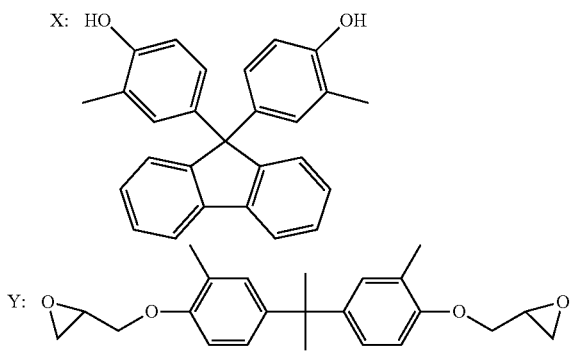

Synthesis Example 2

In a 5-L flask equipped with a stirrer, thermometer, nitrogen purging line and reflux condenser, 325.0 g of compound M-1 and 150.0 g of compound M-2 were dissolved in 2,000 g of toluene. To the solution, 949.6 g of compound M-6 and 6.1 g of compound M-7 were added, and it was heated at 60° C. To the flask, 2.2 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 2.2 g of platinum-on-carbon catalyst (5 wt %) was admitted, and 107.5 g of compound M-5 was added dropwise over 1 hour. At this point, the flask internal temperature rose to 80° C. After the dropwise addition, the reaction solution was ripened for 3 hours at 90° C., then cooled to room temperature. To the reaction solution was added 1,800 g of methyl isobutyl ketone. The reaction solution was filtered through a filter under pressure to remove the platinum catalyst. To the polymer solution thus obtained, 760 g of deionized water was added, followed by stirring and stationary holding for separation. The lower layer or water layer was removed. This washing/separatory operation was repeated 6 times, thereby removing the trace acid value from the polymer solution. The solvent was distilled off in vacuum from the polymer solution and instead, 900 g of cyclopentanone was added. There was obtained a polymer solution (A-2) in cyclopentanone having a solid concentration of 60 wt %. The polymer in the solution was measured for molecular weight by GPC versus polystyrene standards, finding a Mw of 55,000. The polymer corresponded to formula (1) wherein molar fractions a=0.443, b=0.289, c=0.162, and d=0.106, as calculated from the charges. X and Y are as shown below.

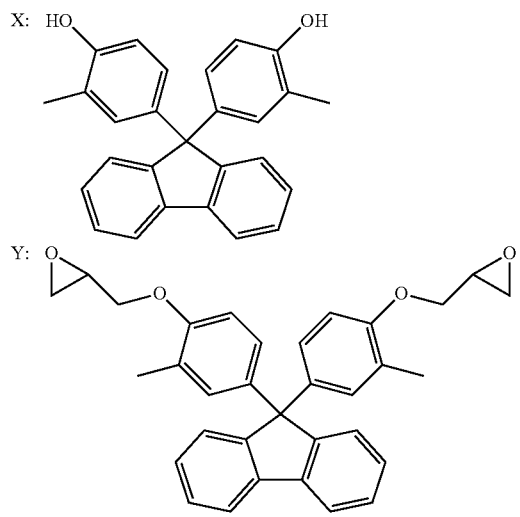

Synthesis Example 3

In a 5-L flask equipped with a stirrer, thermometer, nitrogen purging line and reflux condenser, 405.0 g of compound M-2 and 80.0 g of compound M-3 were dissolved in 1,875 g of toluene. To the solution, 949.6 g of compound M-6 and 6.1 g of compound M-7 were added, and it was heated at 60° C. To the flask, 2.2 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 2.2 g of platinum-on-carbon catalyst (5 wt %) was admitted, and 107.5 g of compound M-5 was added dropwise over 1 hour. At this point, the flask internal temperature rose to 80° C. After the dropwise addition, the reaction solution was ripened for 8 hours at 90° C., then cooled to room temperature. To the reaction solution was added 1,700 g of methyl isobutyl ketone. The reaction solution was filtered through a filter under pressure to remove the platinum catalyst. To the polymer solution thus obtained, 760 g of deionized water was added, followed by stirring and stationary holding for separation. The lower layer or water layer was removed. This washing/separatory operation was repeated 6 times, thereby removing the trace acid value from the polymer solution. The solvent was distilled off in vacuum from the polymer solution and instead, 950 g of cyclopentanone was added. There was obtained a polymer solution (A-3) in cyclopentanone having a solid concentration of 60 wt %. The polymer in the solution was measured for molecular weight by GPC versus polystyrene standards, finding a Mw of 73,000. The polymer corresponded to formula (1) wherein molar fractions a=0.56, b=0.102, c=0.450, and d=0.292, as calculated from the charges. X and Y are as shown below.

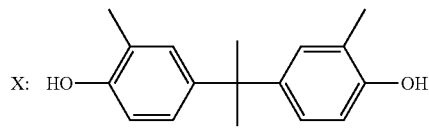

Y:

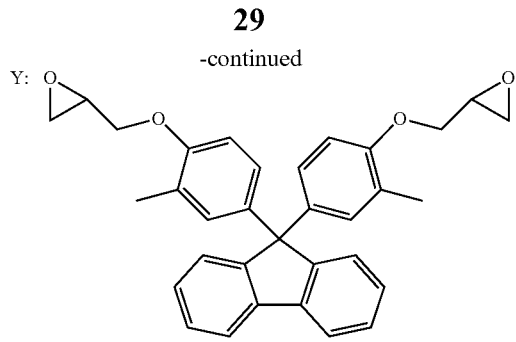

Synthesis Example 4

In a 5-L flask equipped with a stirrer, thermometer, nitrogen purging line and reflux condenser, 450.0 g of compound M-1 was dissolved in 1,875 g of toluene. To the solution, 949.6 g of compound M-6 and 6.1 g of compound M-7 were added, and it was heated at 60° C. To the flask, 2.2 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 2.2 g of platinum-on-carbon catalyst (5 wt %) was admitted, and 107.5 g of compound M-5 was added dropwise over 1 hour. At this point, the flask internal temperature rose to 78° C. After the dropwise addition, the reaction solution was ripened for 1.5 hours at 90° C., then cooled to room temperature. To the reaction solution was added 1,700 g of methyl isobutyl ketone. The reaction solution was filtered through a filter under pressure to remove the platinum catalyst. To the polymer solution thus obtained, 760 g of deionized water was added, followed by stirring and stationary holding for separation. The lower layer or water layer was removed. This washing/separatory operation was repeated 6 times, thereby removing the trace acid value from the polymer solution. The solvent was distilled off in vacuum from the polymer solution and instead, 950 g of cyclopentanone was added. There was obtained a polymer solution (A-4) in cyclopentanone having a solid concentration of 60 wt %. The polymer in the solution was measured for molecular weight by GPC versus polystyrene standards, finding a Mw of 35,000. The polymer corresponded to formula (1) wherein molar fractions a=0.606, b=0.394, c=0, and d=0, as calculated from the charges. X is as shown below.

X:

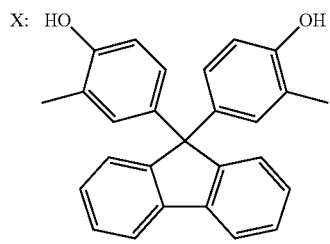

Polymer (B-1) used in Comparative Example 2 and shown in Table 1 is identified below.

B-1: EOCN-1020-55 (Nippon Kayaku Co., Ltd.)

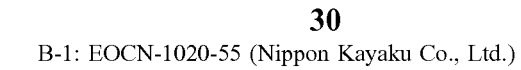

$(n \approx 3 \text{ to } 5)$

The photoacid generators used in Examples and Comparative Examples and shown in Table 1 are identified below.

PAG-1:

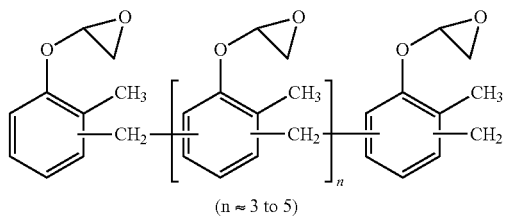

PAG-2:

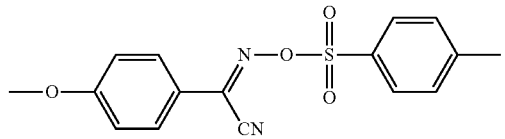

The crosslinker used in Examples and Comparative Examples and shown in Table 1 is identified below.

XL-1:

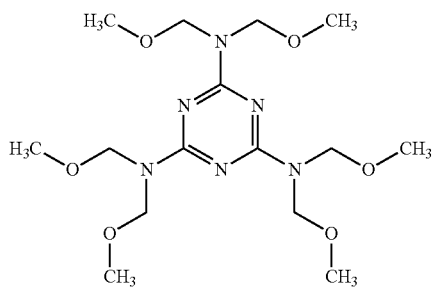

The polyhydric phenols used in Examples and Comparative Examples and shown in Table 1 are identified below.

PH-1:

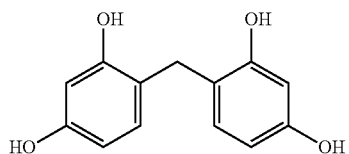 [SMILES: Oc1ccc(Cc2ccc(O)cc2O)c(O)c1]

PH-2:

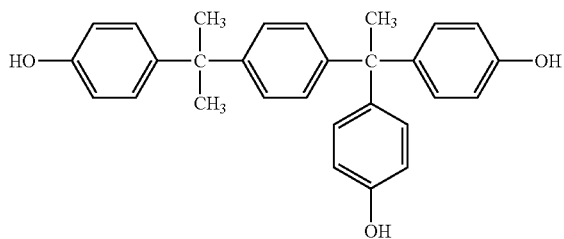 [SMILES: CC(C)(c1ccc(O)cc1)c1ccc(C(C)(c2ccc(O)cc2)c2ccc(O)cc2)cc1]

PH-3:

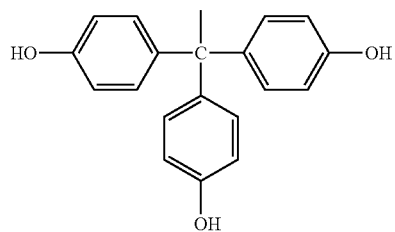 [SMILES: CC(c1ccc(O)cc1)(c1ccc(O)cc1)c1ccc(O)cc1]

The basic compound used in Examples and Comparative Examples and shown in Table 1 is identified below.
AM-1:

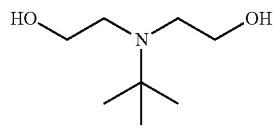

The cure accelerators used in Examples and Comparative Examples and shown in Table 1 are identified below.
U-CAT 5002: dicyclic amidine salt by San-Apro Ltd.
2P4MHZ-PW: imidazole compound by Shikoku Chemicals Corp.

Examples 1 to 15 and Comparative Examples 1, 2

Resist compositions of Examples 1 to 15 and Comparative Examples 1, 2 were prepared from polymers A-1 to A-4 and B-1. The polymer solution was combined with a polyhydric phenol, PAG, crosslinker, basic compound, cure accelerator, and solvent in amounts as shown in Table 1. The procedure involved stirring and mixing for dissolution and precision filtration through a Teflon® filter with a pore size of 0.2 μm.

Comparative Example 3

Example 1 was repeated except that bisphenol A (PH-4) having the following formula was used instead of the polyhydric phenol.
PH-4:

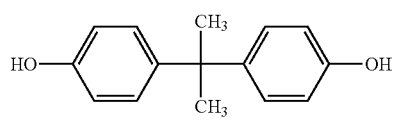

A die coater was used as the film coater and a polyethylene terephthalate (PET) film of 38 μm thick used as the support film. Each of the resist compositions of Examples 1 to 15 and Comparative Examples 1, 2 was coated onto the support film. The coated film was passed through a hot air circulating oven (length 4 m) set at 100° C. over 5 minutes, forming a photo-curable resin layer on the support film. Using a laminating roll, a polyethylene film of 50 μm thick as the protective film was bonded to the photo-curable resin layer under a pressure of 1 MPa, yielding a photo-curable dry film. The thickness of the photo-curable resin layer is reported in Table 1, as measured by an optical interference film thickness gauge.

From each of the photo-curable dry films using the resist compositions in Examples 1 to 15 and Comparative Examples 1, 2 as tabulated in Table 1, the protective film was stripped off. Using a vacuum laminator TEAM-100RF (Takatori Corp.) with a vacuum chamber set at a vacuum of 80 Pa and a temperature of 110° C., the photo-curable resin layer on the support film was closely bonded to a SiN substrate (for alkali resistant test). After restoration of atmospheric pressure, the substrate was taken out of the laminator. The support film was stripped off.

Thereafter, the photo-curable resin layer on substrate was prebaked on a hot plate at 130° C. for 5 minutes for enhancing adhesion to the substrate. Using an exposure tool of contact aligner type, the photo-curable resin layer was exposed to radiation of wavelength 405 nm in a dose of 1,000 mJ/cm$^2$ through a mask having a pattern of 10 mm×10 mm squares. The substrate was baked (PEB) on a hot plate at 120° C. for 5 minutes and cooled. This was followed by spray development in propylene glycol monomethyl ether acetate (PGMEA) for 300 seconds for patterning the resin layer. In Comparative Example 2, no pattern could be formed.

The patterned resin layer on the substrate was post-cured in an oven at 180° C. for 2 hours while the oven was purged with nitrogen.

I. Resistance to Stripper Liquid

The substrate on test was immersed in N-methylpyrrolidone (NMP) at room temperature for 1 hour before it was visually observed for outer appearance and a film thickness change was determined as evaluation of stripper resistance. The results are shown in Table 2.

II. Saturated Vapor Pressure Test

The substrate on test was treated at 121° C., 2 atmospheric pressure and 100% humidity for 168 hours in a test equipment (MODEL PC-422R8 available from HIRAYAMA Co., Ltd.), and then the appearance and thickness change of the substrate on test were evaluated for moisture vapor resistance.

III. Alkali Resistance

The substrate on test was immersed in 10 wt % NaOH aqueous solution for 5, 10 and 30 minutes before its outer appearance was visually observed and a film thickness change was determined as above. The results are shown in Table 2.

TABLE 1

| | | Formulation of resist composition (pbw) | | | | | | Thickness of resin layer (μm) |
|---|---|---|---|---|---|---|---|---|
| | | Polymer | PAG | Crosslinker | Polyhydric phenol | Basic compound | Cure accelerator | Solvent | |
| Example | 1 | A-1 (100) | PAG-1 (1) | XL-1 (15) | PH-1 (15) | | | cyclopentanone (55) | 49.8 |
| | 2 | A-1 (100) | PAG-1 (1) | XL-1 (15) | PH-1 (15) | AM-1 (0.1) | | cyclopentanone (55) | 20.5 |
| | 3 | A-2 (100) | PAG-1 (1) | XL-1 (15) | PH-1 (15) | | | cyclopentanone (55) | 19.8 |
| | 4 | A-3 (100) | PAG-1 (1) | XL-1 (15) | PH-1 (15) | | | cyclopentanone (55) | 20.0 |
| | 5 | A-1 (100) | PAG-2 (2) | XL-1 (15) | PH-1 (15) | | U-CAT5002 (0.1) | cyclopentanone (55) | 95.3 |
| | 6 | A-1 (100) | PAG-2 (0.5) | XL-1 (15) | PH-1 (15) | | | cyclopentanone (55) | 20.1 |
| | 7 | A-1 (100) | PAG-2 (4) | XL-1 (15) | PH-1 (15) | AM-1 (0.2) | | cyclopentanone (55) | 20.0 |
| | 8 | A-1 (100) | PAG-2 (1) | XL-1 (15) | PH-1 (15) | | | cyclopentanone (55) | 19.8 |
| | 9 | A-2 (100) | PAG-1 (1) | XL-1 (5) | PH-1 (15) | | | cyclopentanone (55) | 20.4 |
| | 10 | A-2 (100) | PAG-1 (1) | XL-1 (20) | PH-1 (15) | | | cyclopentanone (55) | 20.3 |
| | 11 | A-1 (100) | PAG-1 (2) | XL-1 (15) | PH-1 (5) | | | cyclopentanone (55) | 20.3 |
| | 12 | A-1 (100) | PAG-1 (2) | XL-1 (15) | PH-1 (20) | | 2P4MHZ-PW (0.03) | cyclopentanone (55) | 50.1 |
| | 13 | A-1 (100) | PAG-1 (2) | XL-1 (15) | PH-2 (15) | | | cyclopentanone (55) | 20.1 |
| | 14 | A-1 (100) | PAG-1 (2) | XL-1 (15) | PH-3 (15) | | | cyclopentanone (55) | 19.9 |
| | 15 | A-4 (100) | PAG-1 (1) | XL-1 (15) | PH-1 (15) | | | cyclopentanone (55) | 20.1 |
| Comparative Example | 1 | A-1 (100) | PAG-1 (1) | XL-1 (15) | | | | cyclopentanone (55) | 20.1 |
| | 2 | B-1 (100) | PAG-1 (1) | XL-1 (15) | PH-1 (15) | | | cyclopentanone (55) | 25.1 |
| | 3 | A-1 (100) | PAG-1 (1) | XL-1 (15) | PH-1 (15) | | | cyclopentanone (55) | 50.0 |

TABLE 2

| | | Resistance to stripper liquid (after NMP immersion) | PCT test | Alkali resistance Immersion time | | |
|---|---|---|---|---|---|---|
| | | | | 5 min. | 10 min. | 30 min. |
| | | | Appearance and film thickness | | | |
| Example | 1 | intact | intact | intact | intact | intact |
| | 2 | intact | intact | intact | intact | intact |
| | 3 | intact | intact | intact | intact | intact |
| | 4 | intact | intact | intact | intact | intact |
| | 5 | intact | intact | intact | intact | intact |
| | 6 | intact | intact | intact | intact | intact |
| | 7 | intact | intact | intact | intact | intact |
| | 8 | intact | intact | intact | intact | intact |
| | 9 | intact | intact | intact | intact | intact |
| | 10 | intact | intact | intact | intact | intact |
| | 11 | intact | intact | intact | intact | intact |
| | 12 | intact | intact | intact | intact | intact |
| | 13 | intact | intact | intact | intact | intact |
| | 14 | intact | intact | intact | intact | intact |
| | 15 | intact | intact | intact | surface wrinkled | surface wrinkled |
| Comparative Example | 1 | intact | intact | intact | pattern stripped | pattern stripped |
| | 2 | | pattern could not be formed | | | |
| | 3 | intact | intact | pattern stripped | pattern stripped | pattern stripped |

Japanese Patent Application No. 2014-202890 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified negative resist composition comprising
  (A) a silicone structure-bearing polymer comprising recurring units of the general formula (1) and having a weight average molecular weight of 3,000 to 500,000,

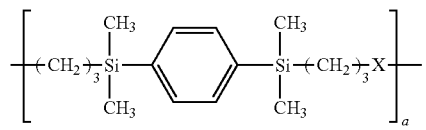
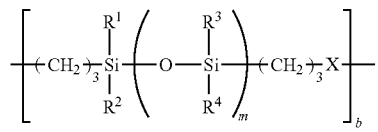
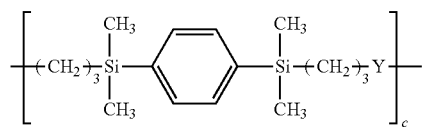
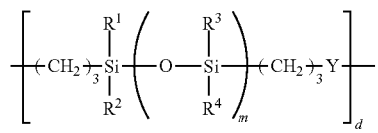

(1)

wherein $R^1$ to $R^4$ are each independently a monovalent $C_1$-$C_8$ hydrocarbon group, m is an integer of 1 to 100, a, b, c and d are each independently 0 or a positive number, a+b>0, and a+b+c+d=1, X is a divalent organic group having the general formula (2):

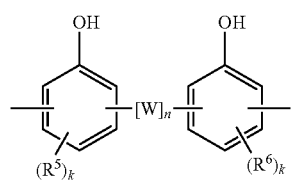

(2)

wherein W is a divalent organic group selected from the following:

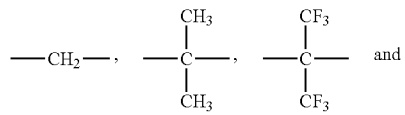

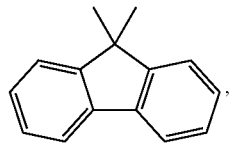

n is 0 or 1, $R^5$ and $R^6$ are each independently a $C_1$-$C_4$ alkyl or alkoxy group, k is independently 0, 1 or 2, Y is a divalent organic group having the general formula (3):

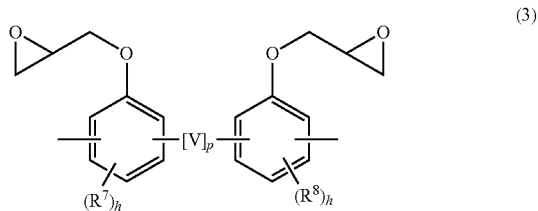

(3)

wherein V is a divalent organic group selected from the following:

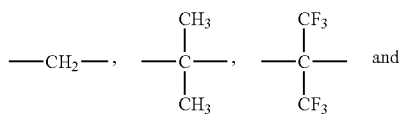

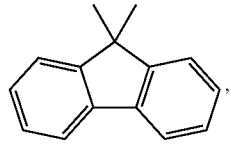

p is 0 or 1, $R^7$ and $R^8$ are each independently a $C_1$-$C_4$ alkyl or alkoxy group, h is independently 0, 1 or 2, (B) at least one compound selected from polyhydric phenols having at least three hydroxyl groups,
  (C) a photoacid generator which is decomposed to generate an acid upon exposure to radiation of wavelength 190 to 500 nm, and
  (D) a solvent,
  wherein component (B) is at least one compound selected from polyhydric phenols having at least three hydroxyl groups as represented by the general formulae (4-A) to (4-E):

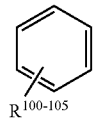

(4-A)

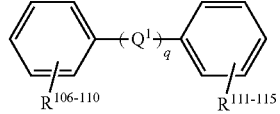

(4-B)

-continued (4-C)
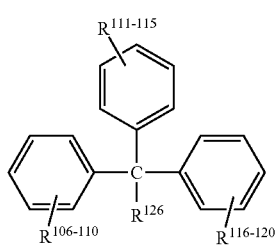

(4-D)
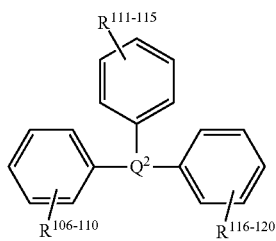

(4-E)
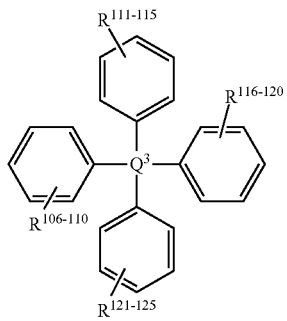

wherein $R^{100}$ to $R^{125}$ are each independently hydrogen, hydroxyl, alkyl, cycloalkyl or aromatic group, which may be halo-substituted, at least three of $R^{100}$ to $R^{125}$ are hydroxyl, $R^{126}$ is hydrogen, hydroxyl, alkyl, cycloalkyl or aromatic group, which may be halo-substituted, $Q^1$ is a structure selected from the following:

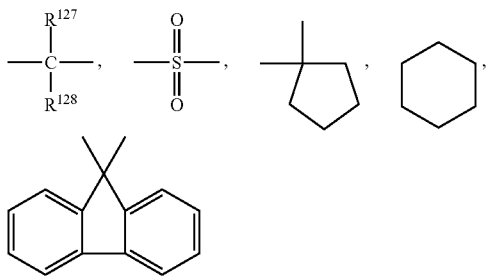

wherein $R^{127}$ and $R^{128}$ are each independently hydrogen, alkyl, cycloalkyl or aromatic group, which may be halo-substituted, q is 0 or 1, $Q^2$ is a structure selected from the following:

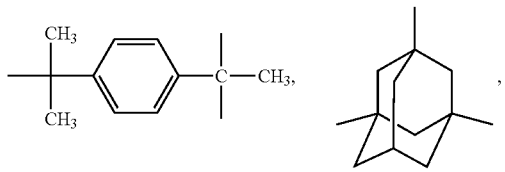

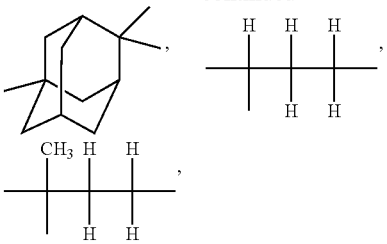

and $Q^3$ is a structure selected from the following:

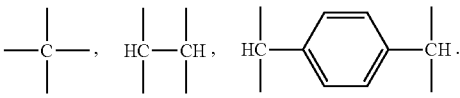

2. The resist composition of claim 1, further comprising (E) at least one crosslinker selected from the group consisting of an amino condensate modified with formaldehyde or formaldehyde-alcohol, a phenol compound having on the average at least two methylol or alkoxymethylol groups in the molecule, and a polyhydric phenol compound in which a hydroxyl group is substituted by a glycidoxy group.

3. A photo-curable dry film comprising a photo-curable resin layer having a thickness of 5 to 300 μm sandwiched between a support film and a protective film, the photo-curable resin layer being formed of the chemically amplified negative resist composition of claim 1.

4. A method for preparing a photo-curable dry film, comprising the steps of:
(i) continuously coating the chemically amplified negative resist composition of claim 1 onto a support film,
(ii) continuously drying the composition to form a photo-curable resin layer on the support film, and
(iii) applying a protective film onto the photo-curable resin layer.

5. A pattern forming process comprising the steps of:
(I) stripping the protective film from the photo-curable dry film of claim 3 and placing the bare photo-curable resin layer in close contact with a substrate,
(II) exposing the photo-curable resin layer to high-energy radiation of wavelength 190 to 500 nm or EB through a photomask and through the support film or with the support film stripped off,
(III) post-exposure bake, and
(IV) developing in a developer to pattern the layer.

6. The process of claim 5, further comprising (V) post-curing the patterned layer resulting from development step (IV) at a temperature of 100 to 250° C.

7. An electric/electronic part protective film comprising the cured film obtained by the process of claim 6.

8. An electric/electronic part protective film comprising the cured film obtained by the process of claim 5.

9. A pattern forming process comprising the steps of:
(1) coating the chemically amplified negative resist composition of claim 1 onto a substrate, and prebaking to form a resist film,
(2) exposing the resist film to high-energy radiation of wavelength 190 to 500 nm or electron beam through a photomask,
(3) baking and developing in a developer to pattern the resist film.

10. The process of claim 9, further comprising (4) post-curing the patterned resist film resulting from development step (3) at a temperature of 100 to 250° C.

11. An electric/electronic part protective film comprising the cured film obtained by the process of claim 9.

12. An electric/electronic part protective film comprising the cured film obtained by the process of claim 10.

* * * * *